United States Patent
Masui

(10) Patent No.: US 11,208,063 B2
(45) Date of Patent: Dec. 28, 2021

(54) IN-VEHICLE POWER SUPPLY DEVICE

(71) Applicant: Yazaki Corporation, Tokyo (JP)

(72) Inventor: Hideaki Masui, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 17/018,298

(22) Filed: Sep. 11, 2020

(65) Prior Publication Data

US 2021/0078514 A1 Mar. 18, 2021

(30) Foreign Application Priority Data

Sep. 13, 2019 (JP) .............................. JP2019-167285

(51) Int. Cl.
*B60R 16/033* (2006.01)
*B60R 16/03* (2006.01)

(52) U.S. Cl.
CPC ............ *B60R 16/03* (2013.01); *B60R 16/033* (2013.01)

(58) Field of Classification Search
CPC . B60R 16/02; B60R 16/0207; B60R 16/0238; B60R 16/0239; B60R 16/03; B60R 16/033

See application file for complete search history.

(56) References Cited

U.S. PATENT DOCUMENTS

| 4,473,755 A | 9/1984 | Imai et al. |
| 4,777,455 A | 10/1988 | Sakamoto et al. |
| 2015/0001926 A1* | 1/2015 | Kageyama ............. E05B 81/86 307/10.1 |
| 2015/0229071 A1* | 8/2015 | Degen .................. H01R 13/627 439/712 |
| 2017/0012592 A1* | 1/2017 | Tanimizu ................ H01F 17/06 |
| 2018/0304826 A1* | 10/2018 | Yahagi ..................... H01F 27/29 |
| 2019/0245435 A1* | 8/2019 | Botti ....................... H02M 3/07 |
| 2021/0099072 A1* | 4/2021 | Uryu ..................... H02M 7/003 |

FOREIGN PATENT DOCUMENTS

| EP | 3119173 A1 | 1/2017 |
| JP | 2012-105081 A | 5/2012 |
| WO | 2014/076987 A1 | 5/2014 |

\* cited by examiner

*Primary Examiner* — Levi Gannon

(74) *Attorney, Agent, or Firm* — Banner & Witcoff, Ltd.

(57) ABSTRACT

The present invention includes one or more adjustment units configured to house one or more electric components that affect impedance in an output of power supply parts in a unit housing in which at least a connection portion has a predetermined shape and size; and a unit support part that is disposed inside the power supply part or between the output of the power supply part and loads and that detachably supports the adjustment unit. When impedance of a wire harness on the output side and the loads changes depending on a difference in a vehicle type, sufficient noise reduction is realized only by replacing the adjustment unit to be mounted without changing a configuration of a main body of the power supply part. Since a component and a component number can be used in common regardless of the difference in the vehicle type, cost can be reduced.

7 Claims, 7 Drawing Sheets

IN-VEHICLE POWER SUPPLY DEVICE

CROSS REFERENCE TO RELATED APPLICATIONS

This application is based on and claims priority from Japanese patent application No. 2019-167285 filed on Sep. 13, 2019, the entire contents of which are incorporated herein by reference.

TECHNICAL FIELD

The present invention relates to an in-vehicle power supply device, and more particularly to a technology for reducing noise generated by a power supply.

BACKGROUND ART

For example, a power supply such as an in-vehicle battery capable of supplying a large amount of power is mounted on a vehicle such as an electric vehicle. Such a power supply includes a DC/DC converter in order to be able to supply the power supply power having an appropriate voltage with respect to various loads. Since such a DC/DC converter adopts a pulse width modulation (PWM) control, switching of a large current is periodically repeated at a high speed such that relatively large noise is generated in a frequency region such as a high frequency due to the switching thereof. Since the noise generated by the power supply propagates to various portions of the vehicle via each electric wire of a wire harness and adversely affects a load on the vehicle, the noise generated by the power supply is required to be reduced.

Therefore, for example, a high-frequency noise filter for an in-vehicle device in Patent Document 1 describes a technology for obtaining a sufficient noise reduction effect in a frequency band assumed at the time of designing even when a conductor connected to the ground is not exposed near the load on the vehicle that radiates electromagnetic noise.

CITATION LIST

Patent Literature

[Patent Document 1] JP-A-2012-105081

When the above-described noise is reduced in the vehicle, for example, as described in Patent Document 1, a noise filter including a capacitor is generally connected between a power supply line and a ground line. Actually, as a countermeasure against noise, a design in which the noise filter is added to an internal circuit of the DC/DC converter or the noise filter is inserted into an end part and an intermediate part of each electric wire of the wire harness is performed.

However, for example, since a length of the electric wire of the wire harness connected to the output side of the power supply and a type of load connected thereto change for each type of vehicle, output impedance viewed from the power supply side may vary for each vehicle. When the output impedance varies, the variation thereof may affect a characteristic of the noise filter, and a sufficient noise reduction effect may not be obtained.

Therefore, as the countermeasure against noise in the vehicle, it is required to take measures individually for each vehicle, such that there is a problem that cost for work such as a design change increases. When different types of noise filters may be mounted on the internal circuit of the DC/DC converter for each vehicle type or the noise filter mounted on the wire harness is changed, component numbers of the DC/DC converter and the wire harnesses vary depending on each vehicle type such that commonization of the component is hindered and thus cost increases.

SUMMARY OF INVENTION

The present invention has been made in consideration of the above-described circumstances, and an object thereof is to provide an in-vehicle power supply device in which a sufficient countermeasure against noise can be performed, and commonization of a component number of a power supply component can be performed even when a vehicle type on which the in-vehicle power supply device is mounted is different.

An in-vehicle power supply device that includes a power supply part including a noise generation source and one or more output terminal capable of connecting a desired load to an output of the power supply part, the device comprising:

one or more adjustment units configured to house one or more electric components that affect impedance in the output of the power supply part in a unit housing in which at least a connection portion has a predetermined shape and size; and a unit support part that is disposed inside the power supply part or between the output of the power supply part and the load, and that detachably supports the adjustment unit.

The present invention is briefly described above. The details of the present invention will be further clarified by reading through a mode for performing the invention described below (hereinafter, referred to as an "embodiment") with reference to the accompanying drawings.

DESCRIPTION OF EMBODIMENTS

Hereinafter, a specific embodiment according to the present invention will be described with reference to each drawing.

First Configuration Example of In-vehicle Power Supply Device

Figure 1:
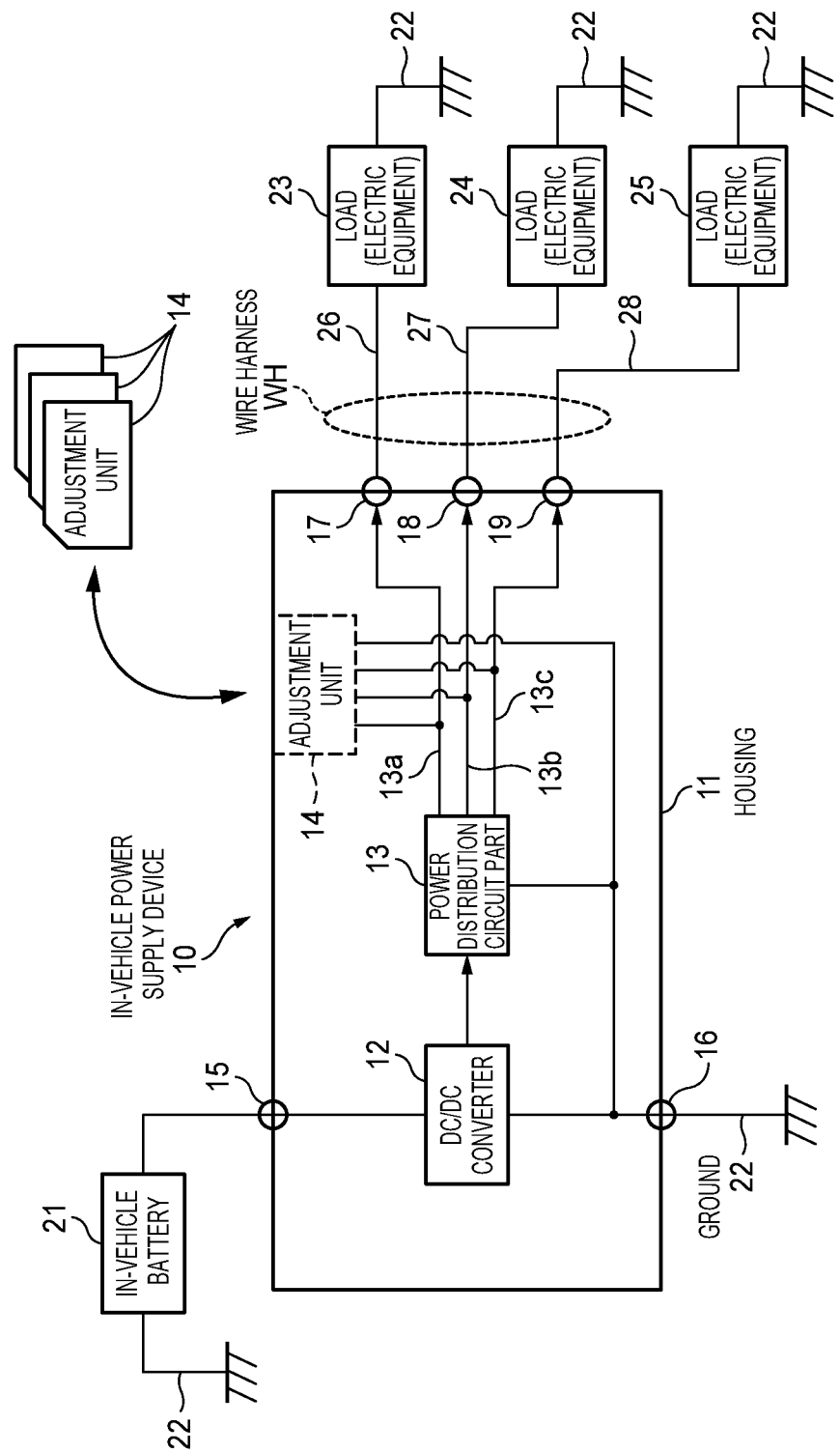
FIG. 1 is a block diagram illustrating a first configuration example of an in-vehicle power supply device according to an embodiment of the present invention.

FIG. 1 is a block diagram illustrating a first configuration example of an in-vehicle power supply device 10 according to an embodiment of the present invention.

The in-vehicle power supply device 10 illustrated in FIG. 1 is mounted on a vehicle such as an electric vehicle and a hybrid vehicle, generates desired power supply power based upon power supply power to be supplied from an in-vehicle battery 21, and is used to respectively supply the generated power supply power to various loads 23, 24, and 25. The loads 23, 24, and 25 are, for example, in-vehicle electric components such as various electronic control units (ECUs), motors, lamps, and heaters.

In the example illustrated in FIG. 1, a power supply input terminal 15 and a ground terminal 16 provided in a housing 11 of the in-vehicle power supply device 10 are respectively connected to a positive electrode of the in-vehicle battery 21 and a ground 22. The loads 23, 24, and 25 are respectively connected to a plurality of output terminals 17, 18, and 19 provided in the housing 11 via electric wires 26, 27, and 28 of a wire harness WH.

The in-vehicle power supply device 10 includes a DC/DC converter 12 and a power distribution circuit part 13 incorporated therein. The DC/DC converter 12 has a function of converting a voltage of the power supply power to be supplied from the in-vehicle battery 21 (for example, 200 [V]) into a desired power supply voltage required by the load (for example, 12 [V]). Specifically, PWM control is performed by periodically turning on and off a switching device which is not illustrated inside the DC/DC converter 12, thereby generating the desired power supply voltage with a relatively small loss.

When the DC/DC converter 12 supplies a large current to the output side, a relatively large electrical noise is generated particularly in a region having a high frequency according to a periodic current switching operation. Since a heat generation amount of the DC/DC converter 12 increases due to internal loss, it is required to take a heat radiation countermeasure to suppress temperature rise.

The power distribution circuit part 13 distributes the power supply power to be supplied from an output of the DC/DC converter 12 to a plurality of systems, and then respectively supplies the distributed power supply power to the loads 23 to 25 via output power supply lines 13a to 13c, the output terminals 17 to 19, and the electric wires 26 to 28.

Description of Noise

On the other hand, high frequency electrical noise generated inside the DC/DC converter 12 may also be transmitted to the loads 23 to 25 from the output of the DC/DC converter 12 via the power distribution circuit part 13, the power supply lines 13a to 13c, the output terminals 17 to 19, and the electric wires 26 to 28. The noise is emitted as unnecessary radiation from the electric wires 26 to 28, thereby adversely affecting the reception of in-vehicle radio, or the noise transmitted to the loads 23 to 25 may cause undesired function of various ECUs.

In order to reduce the above-described noise, generally, a noise filter is mounted on an internal circuit of the in-vehicle power supply device 10 and the wire harness WH as necessary. However, a length of each of the electric wires 26 to 28 of the wire harness WH and a type of each of the loads 23 to 25 change depending on a difference in a vehicle type of a vehicle on which the in-vehicle power supply device 10 is mounted. That is, impedance Z when the load side is viewed from the output of the in-vehicle power supply device 10 changes depending on the vehicle type. Accordingly, when the impedance Z changes, a noise reduction characteristic of the noise filter mounted thereon also changes.

Therefore, in order to reduce the noise transmitted to the loads 23 to 25 via the wire harness WH and the noise radiated from the wire harness WH within an allowable range, at the time of designing, it is required to individually perform a different countermeasure against noise for each vehicle type, thereby causing an increase in cost. For example, even when the types of the loads 23 to 25 changes because a user changes option selection, the impedance Z changes such that a noise level changes.

Countermeasure Against Noise of the Embodiment

In the in-vehicle power supply device 10 illustrated in FIG. 1, one adjustment unit 14 selected from a plurality of types of adjustment units 14 prepared in advance can be mounted on the housing 11 as necessary. The adjustment unit 14 is configured to be attachable and detachable to and from the housing 11. Each of the plurality of adjustment units 14 incorporates one or more noise filters respectively having different characteristics. Each noise filter in the adjustment unit 14 mounted on the housing 11 is connected between each of the output power supply lines 13a to 13c and the ground 22.

When the impedance Z changes depending on the difference in the vehicle type of the vehicle on which the in-vehicle power supply device 10 is mounted, the noise reduction characteristic in the adjustment unit 14 mounted on the housing 11 changes, such that the noise transmitted to the loads 23 to 25 via the wire harness WH and the noise radiated from the wire harness WH may exceed the allowable range. Therefore, the adjustment unit 14 is replaced with another one having an appropriate specification, such that the noise can be reduced within the allowable range by corresponding to a change in the impedance Z.

Here, with respect to a main body of the in-vehicle power supply device 10 other than the adjustment unit 14, since it is not required to change a circuit component, a component number of a component and a unit number of a unit can be used in common regardless of the difference in the vehicle type. Accordingly, the component cost and the manufacturing cost of the device can be reduced by commonization of the components. Since only the adjustment unit 14 is replaced, man-hours required for designing for a countermeasure against noise can be reduced.

Configuration Example of Adjustment Unit

Figure 2:
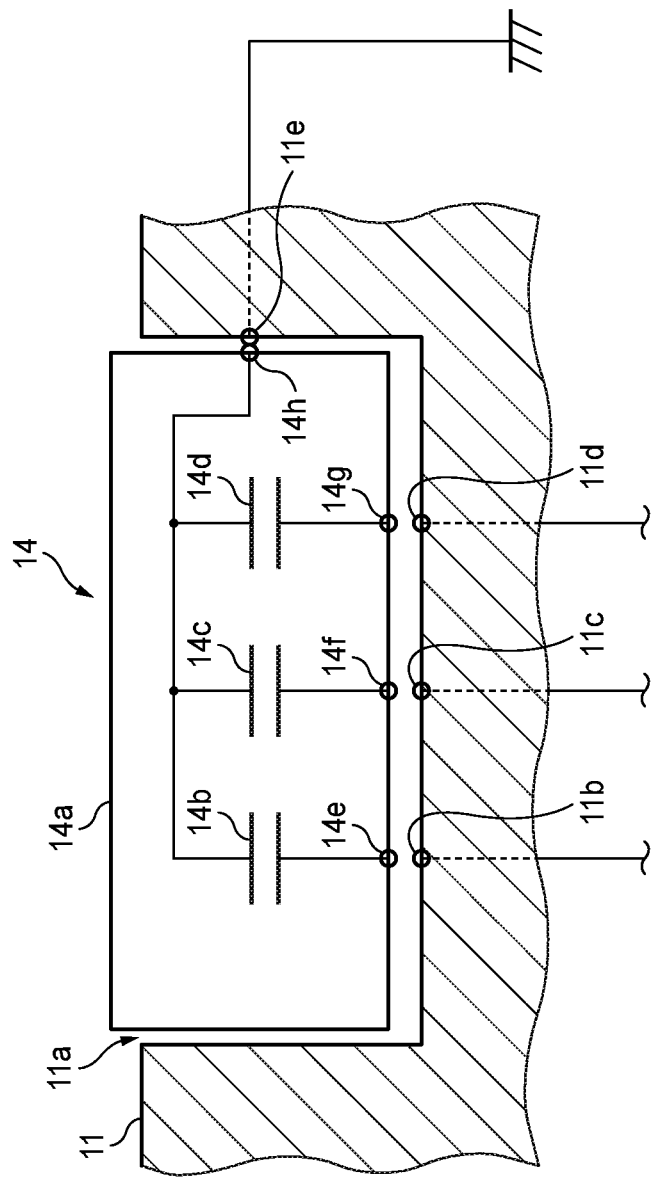
FIG. 2 is a longitudinal cross-sectional view illustrating a configuration example of an adjustment unit in a state of being mounted on a housing of the in-vehicle power supply device.

FIG. 2 is a longitudinal cross-sectional view illustrating a configuration example of the adjustment unit 14 in a state of being mounted on the housing 11 of the in-vehicle power supply device 10.

At least a connection portion of the adjustment unit 14 is formed in a predetermined shape and size, and is configured in a rectangular parallelepiped shape or a card shape as a whole. A recessed part 11a having a shape and size capable of receiving the adjustment unit 14 is formed in the housing 11.

In the example illustrated in FIG. 2, the adjustment unit 14 includes three capacitors 14b, 14c, and 14d incorporated therein. Since each of these capacitors 14b to 14d includes a residual inductance inside, in a high frequency region, equivalently, a circuit in which a capacitance component (C) of one capacitor and a residual inductance component (L) thereof are connected in series is formed, and each of these capacitors 14b to 14d functions as a self-resonant trap filter. That is, since the impedance of the circuit decreases near a resonance frequency, noise can be reduced by connecting this noise filter between the power supply line and the ground.

Here, in the actual in-vehicle power supply device 10, since a parallel circuit of impedance Zf of each of the capacitors 14b to 14d and the impedance Z on the load side is configured, a degree of noise reduction changes according to the change in the impedance Z. Therefore, the adjustment unit 14 having an appropriate characteristic is selected from the plurality of adjustment units 14 prepared in advance and mounted on the recessed part 11a, such that an noise reduction effect in the actual vehicle can be improved, and the noise transmitted to the loads 23 to 25 and the noise radiated from the wire harness WH can be reduced within the allowable range.

With respect to the types of the plurality of adjustment units 14 prepared in advance, at the time of designing, the required number of types is prepared in consideration of a difference in a length and a thickness of the electric wire of the wire harness WH mounted on each vehicle, and a difference in types of the loads 23 to 25 and a combination thereof.

The adjustment unit 14 illustrated in FIG. 2 is disposed in a state where a plurality of electrodes 14e, 14f, 14g, and 14h are exposed on a surface of a unit housing 14a. Electrodes 11b, 11c, 11d, and 11e are provided at locations opposite to the electrodes 14e, 14f, 14g, and 14h of the adjustment unit 14 on the side of the recessed part 11a of the housing 11. That is, a pair of the electrodes 14e and 11b, the electrodes 14f and 11c, the electrodes 14g and 11d, and the electrodes 14h and 11e are electrically connected to each other in a state where the adjustment unit 14 is fitted into the recessed part 11a.

The capacitor 14b in the adjustment unit 14 includes one end connected to the electrode 14e and the other end connected to the electrode 14h. The capacitor 14c includes one end connected to the electrode 14f and the other end connected to the electrode 14h. The capacitor 14d includes one end connected to the electrode 14g and the other end connected to the electrode 14h.

The respective electrodes 11b, 11c, 11d, and 11e on the side of the housing 11 of the in-vehicle power supply device 10 are respectively connected to the output power supply lines 13a, 13b, 13c, and the ground 22.

Therefore, when the adjustment unit 14 having the configuration illustrated in FIG. 2 is used, the capacitance of the capacitor 14b is designed so that an appropriate noise reduction characteristic can be obtained with respect to the impedance Z determined by the electric wire 26 connected to the output terminal 17 and the load 23. In the same manner, the capacitance of the capacitor 14c is designed so that an appropriate noise reduction characteristic can be obtained with respect to the impedance Z determined by the electric wire 27 and the load 24. The capacitance of the capacitor 14d is designed so that an appropriate noise reduction characteristic can be obtained with respect to the impedance Z determined by the electric wire 28 and the load 25.

That is, in consideration of the impedance Z according to the combination of the wire harness WH and the loads 23 to 25, the capacitance of each of the capacitors 14b to 14d is determined at the time of designing for each vehicle type of all vehicles having a possibility of mounting the in-vehicle power supply device 10, and the adjustment unit 14 is manufactured and prepared for each vehicle type.

First Example of External Appearance of In-vehicle Power Supply Device

Figure 3:
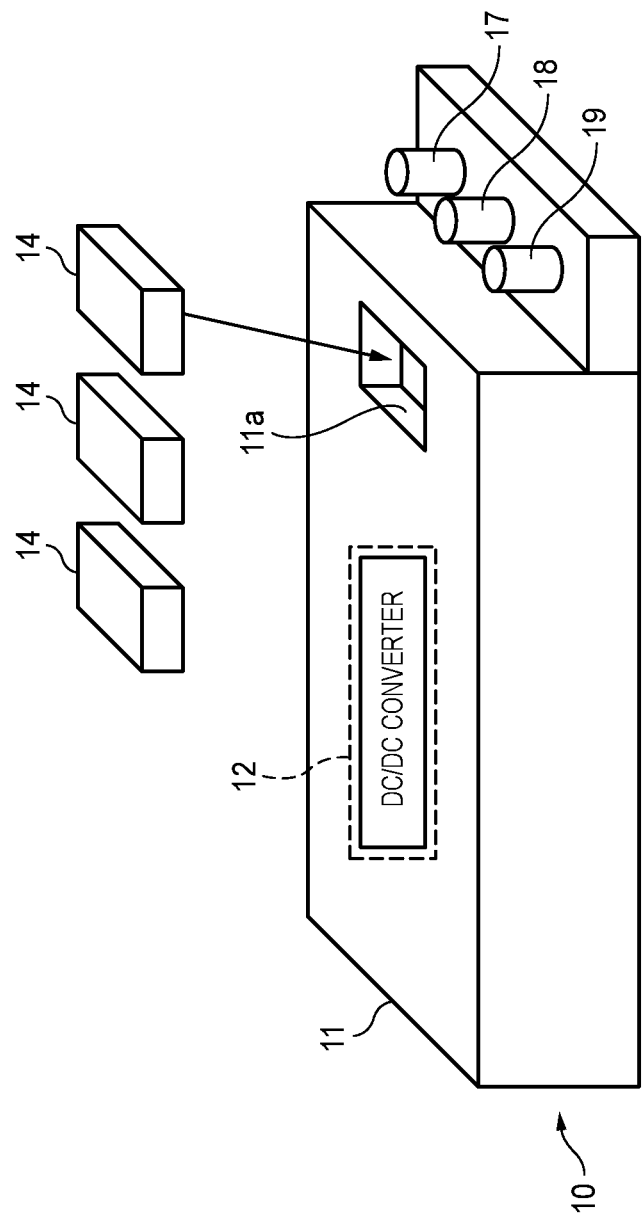
FIG. 3 is a perspective view illustrating an outline of an external appearance in the first configuration example of the in-vehicle power supply device.

FIG. 3 illustrates an outline of an external appearance in the first configuration example of the in-vehicle power supply device 10.

In the example illustrated in FIG. 3, the housing 11 of the in-vehicle power supply device 10 is formed in a box shape, and the output terminals 17 to 19 are disposed at an end part of the housing 11. One recessed part 11a is formed on an upper surface of the housing 11. A shape and a size of the recessed part 11a are formed in a state of being able to be fitted to an insertion part of the adjustment unit 14.

As illustrated in FIG. 3, since a plurality of types of adjustment units 14 having the same shape and size are manufactured and prepared in advance, for example, an operator who installs the in-vehicle power supply device 10 in the vehicle can select any one of the adjustment units 14 suitable for the vehicle type and mount the selected adjustment unit 14 on the recessed part 11a of the housing 11. Here, the type of the adjustment unit 14 selected by the operator has a filter characteristic optimized for the noise reduction in consideration of the impedance Z of the wire harness WH and the loads 23 to 25 depending on the difference in the vehicle type. The main body of the in-vehicle power supply device 10 is not required to be replaced depending on the difference in the vehicle type of the vehicle on which the in-vehicle power supply device 10 is mounted, and has a common configuration as a whole.

Second Example of External Appearance of In-vehicle Power Supply Device

Figure 4:
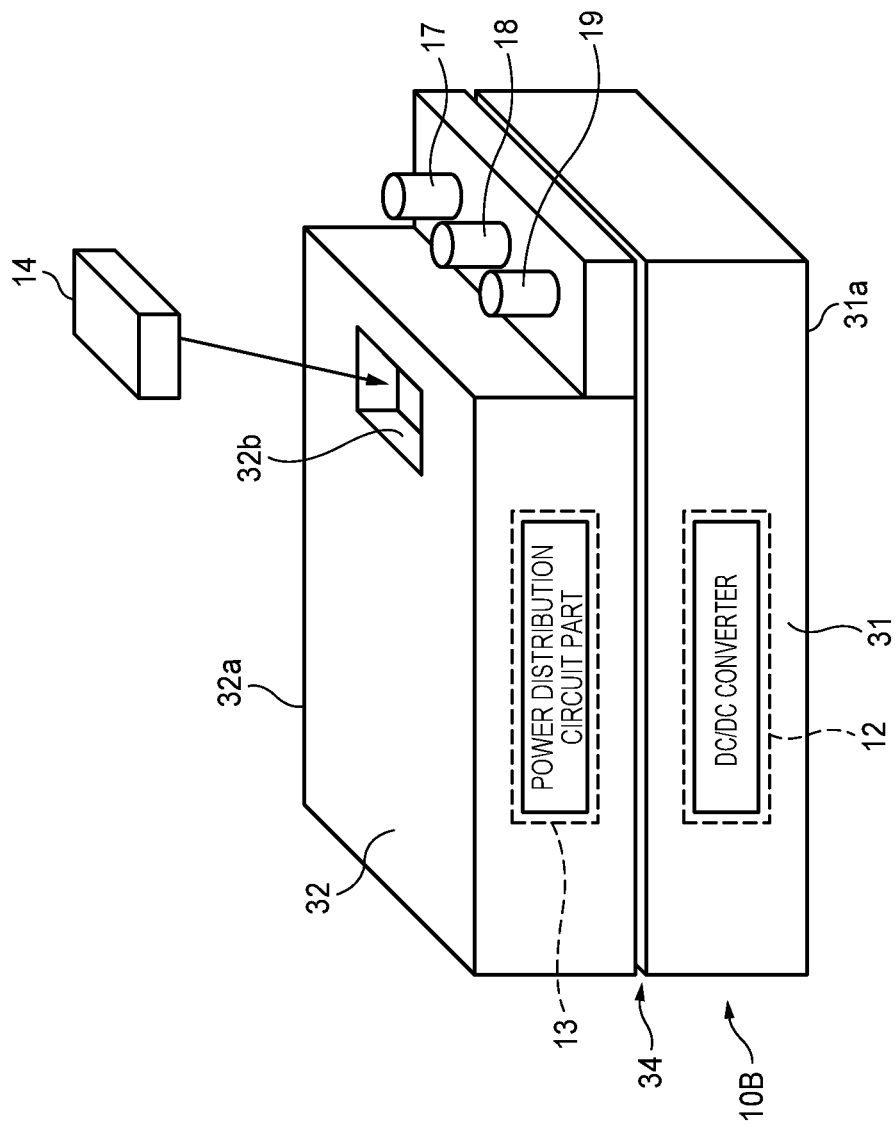
FIG. 4 is a perspective view illustrating an outline of an external appearance in a second configuration example of the in-vehicle power supply device.

FIG. 4 illustrates an outline of an external appearance in a second configuration example of the in-vehicle power supply device 10.

In an in-vehicle power supply device 10B illustrated in FIG. 4, the DC/DC converter 12 is housed in a housing 31a of a converter unit 31. The power distribution circuit part 13 is housed in a housing 32a of a power distribution unit 32. That is, the in-vehicle power supply device 10B has a configuration in which the converter unit 31 and the power distribution unit 32, which are separately configured by the mutually independent housings 31a and 32a, are combined and integrated.

In the example in FIG. 4, in order to enable the flow of cooling air, a slight space 34 having a substantially constant gap is formed between converter unit 31 and the power distribution unit 32. The converter unit 31 and the power distribution unit 32 are configured as separate bodies, thereby making it possible to reduce an adverse influence on the converter unit 31 and the power distribution unit 32 due to the heat generation. That is, it is possible to prevent an environmental temperature of the power distribution circuit part 13 from rising due to an influence of heat by the DC/DC converter 12 having a large amount of heat generation. Particularly, by flowing the cooling air in the space 34, a heat insulating layer is formed in the space 34, and the temperature rise on the side of the power distribution unit 32 can be effectively prevented.

In the configuration of FIG. 4, a recessed part 32b is formed on an upper surface of the housing 32a on the side of the power distribution unit 32. One adjustment unit 14 prepared in advance is fitted into the recessed part 32b, such that the mounted adjustment unit 14 can be connected to an electric circuit of the power distribution unit 32.

The operator can appropriately select the adjustment unit 14 to be mounted for each vehicle type, such that the noise reduction characteristic can be optimized according to the impedance Z of the wire harness WH connected to the output terminals 17 to 19 and the loads 23 to 25.

Second Configuration Example of In-vehicle Power Supply Device

Figure 5:
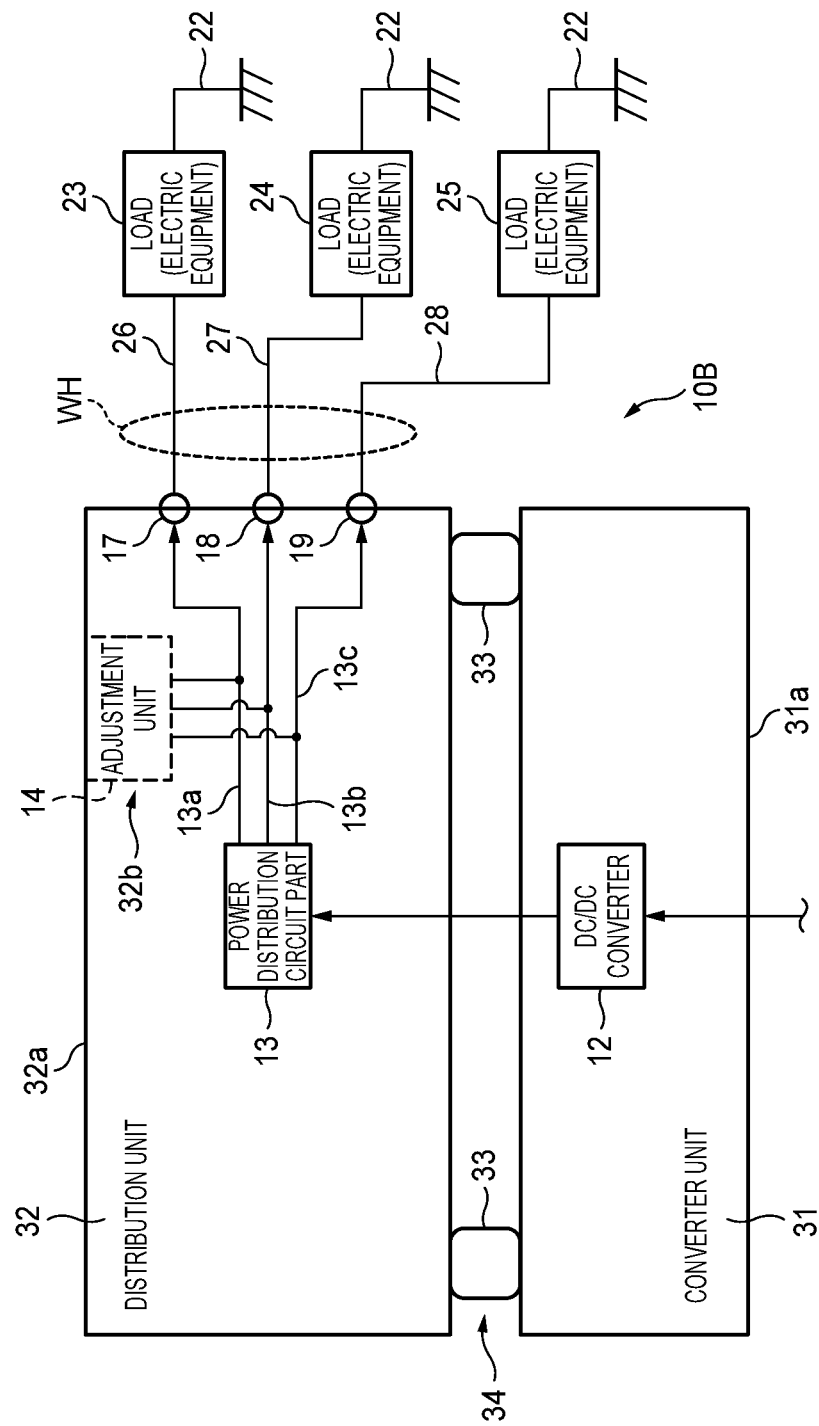
FIG. 5 is a block diagram illustrating an electric circuit in the second configuration example of the in-vehicle power supply device.

FIG. 5 illustrates an electric circuit in the second configuration example of the in-vehicle power supply device 10.

In the example illustrated in FIG. 5, the space 34 between the converter unit 31 and the power distribution unit 32 is kept constant by a spacer 33 disposed therebetween. Air can be flown in the space 34.

As illustrated in FIG. 5, the DC/DC converter 12 is disposed in the housing 31a of the converter unit 31, and the power distribution circuit part 13 is disposed in the housing 32a of the power distribution unit 32. In the configuration of FIG. 5, in the same manner as that of FIG. 1, the power supply power to be supplied from the in-vehicle battery 21 is inputted to the DC/DC converter 12, and the DC/DC converter 12 generates the power supply power required by the load side.

The power supply power generated by the DC/DC converter 12 in the converter unit 31 is supplied to the input side of the power distribution circuit part 13 in the power distribution unit 32. The power distribution circuit part 13 appropriately distributes the power supply power supplied from the output of the DC/DC converter 12 to each load system, and the distributed power supply power is outputted to the output power supply lines 13a to 13c as necessary.

The adjustment unit 14 is mounted on the recessed part 32b of the power distribution unit 32, such that the respective capacitors 14b to 14d in the adjustment unit 14 are respectively connected to the output power supply lines 13b to 13d and the ground 22.

The influence of the electrical noise generated by the switching of the large current in the DC/DC converter 12 is transmitted through each path of the output power supply lines 13a to 13c, and is radiated as unnecessary radiation from the electric wires 26 to 28 or inputted to the loads 23 to 25 as noise. Such noise is reduced by the adjustment unit 14 mounted on the power distribution unit 32.

The adjustment unit 14 is used to sufficiently reduce the noise, such that it is not required to add the noise filter to the wire harness WH. However, when the type of the wire harness WH and the types of the loads 23 to 25 change depending on the difference in the vehicle type, the impedance Z on the output side of the power distribution unit 32 changes and thus the noise reduction characteristic changes. Therefore, it is important to select and mount the adjustment unit 14 having an appropriate characteristic depending on the vehicle type of the vehicle on which the in-vehicle power supply device 10B is mounted.

Specific Example of External Appearance

Figure 6:
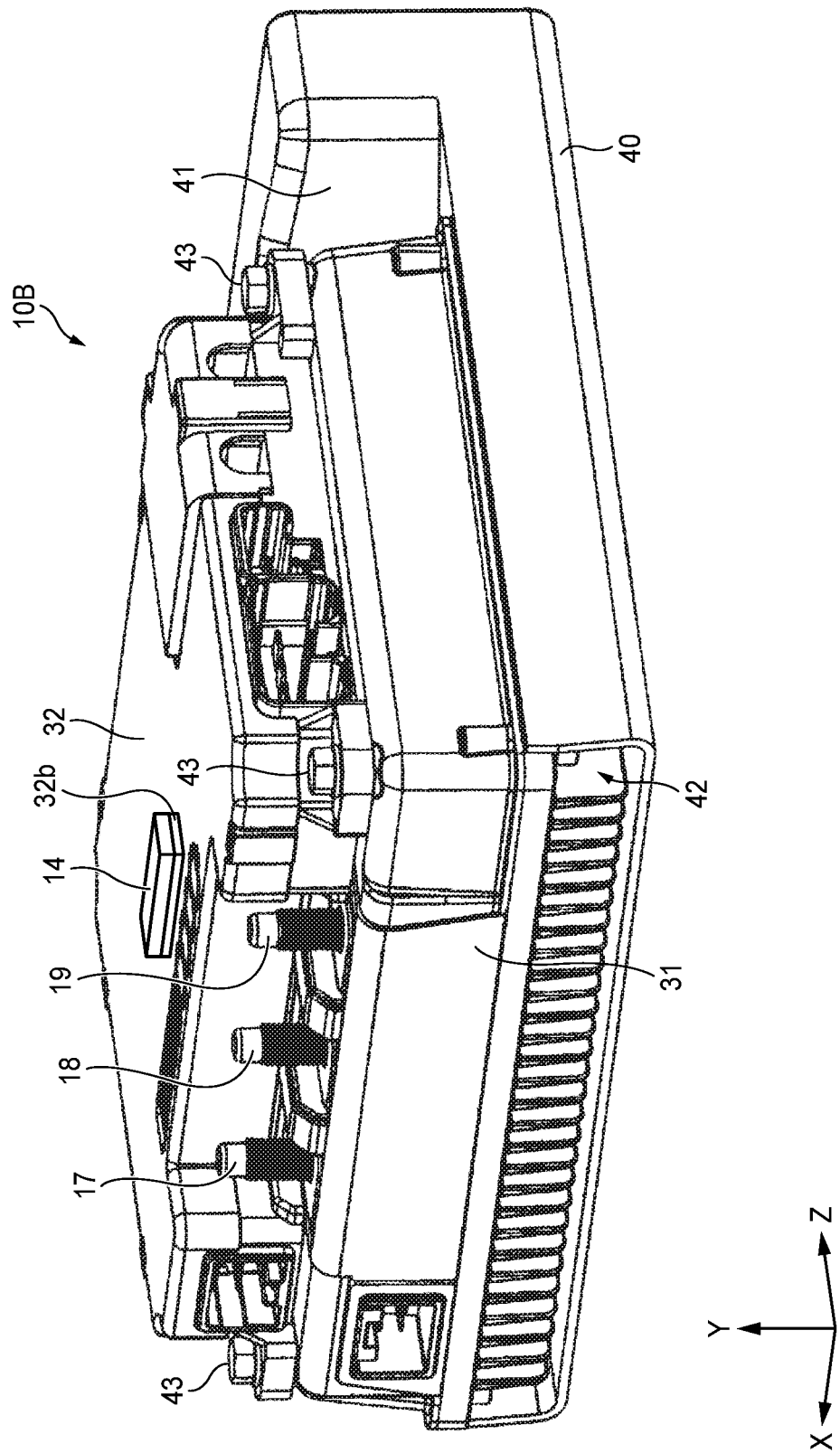
FIG. 6 is a perspective view illustrating a specific example of the external appearance in the second configuration example of the in-vehicle power supply device.

FIG. 6 illustrates a specific example of the external appearance in the second configuration example of the in-vehicle power supply device 10.

In the in-vehicle power supply device 10B illustrated in FIG. 6, the power distribution unit 32 and the converter unit 31 disposed above and below are fixed and integrated by a plurality of bolts 43. In order to effectively prevent the temperature rise, the in-vehicle power supply device 10B is disposed on the upper side of an air blowing unit 40, and a heat sink 42 is disposed below the converter unit 31.

The air blowing unit 40 can blow air in a direction opposite to an arrow of a Z axis illustrated in the drawing by an air blower, which is not illustrated, disposed in an air blowing part 41 on the back side. An air flow generated by the air blowing is guided so as to respectively flow through each space between fins of the lower-side heat sink 42 and the space 34 between the converter unit 31 and the power distribution unit 32, thereby achieving effective forced air cooling.

Description of Modification

Figure 7:
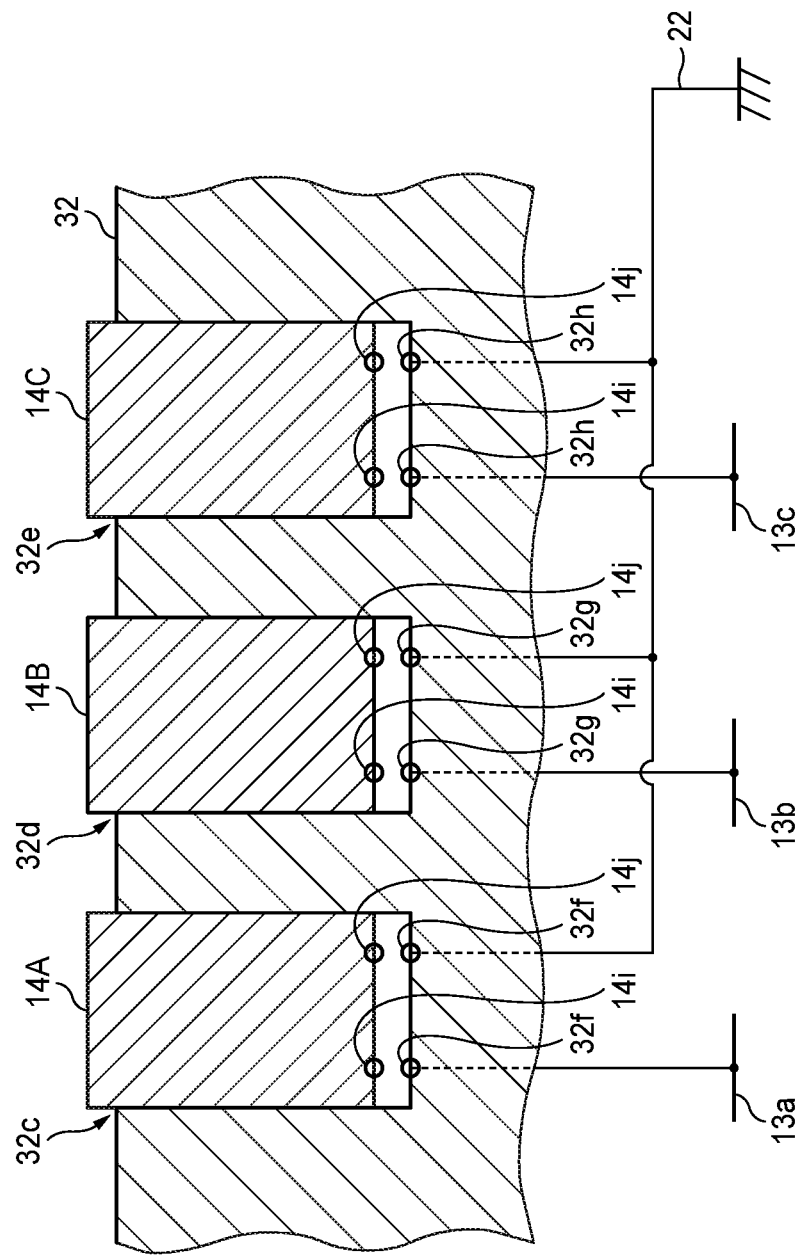
FIG. 7 is a longitudinal cross-sectional view illustrating a mounting state of a plurality of adjustment units according to a modification.

FIG. 7 is a longitudinal cross-sectional view illustrating a mounting state of a plurality of adjustment units according to a modification.

In the modification illustrated in FIG. 7, a plurality of recessed parts 32c, 32d, and 32e that are independent of each other are formed in the housing 32a of the power distribution unit 32. Each of the plurality of adjustment units 14A, 14B, and 14C illustrated in FIG. 7 includes only one system of noise filter (capacitor) incorporated therein.

That is, since the plurality of recessed parts 32c, 32d, and 32e are formed in the housing 32a, the plurality of adjustment units 14A, 14B, and 14C can be simultaneously mounted on these parts as illustrated in FIG. 7.

The respective adjustment units 14A, 14B, and 14C respectively include two electrodes 14i and 14j. One end of the noise filter (capacitor) in the adjustment units 14A, 14B, and 14C is connected to the electrode 14i and the other end thereof is connected to the electrode 14j.

Two electrodes 32f are formed at locations opposite to the electrodes 14i and 14j in the recessed part 32c. Two electrodes 32g are formed at locations opposite to the electrodes 14i and 14j in the recessed part 32d. Two electrodes 32h are formed at locations opposite to the electrodes 14i and 14j in the recessed part 32e.

Therefore, the electrodes 14i and 14j of the adjustment unit 14A illustrated in FIG. 7 are respectively connected to the output power supply line 13a of one system and the ground 22 via the electrodes 32f. The electrodes 14i and 14j of the adjustment unit 14B are respectively connected to the output power supply line 13b of one system and the ground 22 via the electrodes 32g. The electrodes 14i and 14j of the adjustment unit 14C are respectively connected to the output power supply line 13c of one system and the ground 22 via the electrodes 32h.

In the case of the modification illustrated in FIG. 7, with respect to the change in the impedance Z of the wire harness WH and the loads 23 to 25, a noise characteristic can be adjusted by using the individual adjustment units 14A to 14C for each system of the output terminals 17 to 19. Therefore, while it is required to simultaneously mount a plurality of adjustment units 14A to 14C on the power distribution unit 32, it is possible to reduce the total number of types of adjustment units 14A to 14C prepared in advance depending on the vehicle type.

[1] An in-vehicle power supply device (10) that includes a power supply part (the DC/DC converter 12) including a noise generation source and one or more output terminal (17 to 19) capable of connecting a desired load to an output of the power supply part, the device including:

one or more adjustment units (14) configured to house one or more electric components (the capacitors 14b to 14d) that affect impedance in the output of the power supply part in a unit housing (14*a*) in which at least a connection portion has a predetermined shape and size; and a unit support part (the recessed part 11*a*) that is disposed inside the power supply part or between the output of the power supply part and the load, and that detachably supports the adjustment unit.

According to the in-vehicle power supply device having the above-described configuration [1], a noise level outputted from the power supply part is reduced according to a unique characteristic of the adjustment unit mounted on the unit support part. Therefore, when a noise characteristic deteriorates due to an impedance change according to a specification difference such as a type of an electric wire of a wire harness connected to a downstream side of the output terminal and a type of load, the deterioration of the noise characteristic can be handled only by changing the adjustment unit to be actually mounted. For example, when a plurality of types of adjustment units having impedance characteristics different from each other are prepared in advance, a desired impedance characteristic can be obtained only by replacing the type of the adjustment unit to be mounted, and the noise level can be improved. Therefore, even when the in-vehicle power supply device is mounted on various types of vehicles, a component of a main body of the in-vehicle power supply device can be used in common, and thus the cost can be reduced.

[2] In the in-vehicle power supply device, the power supply part may include: a switching unit (the converter unit 31) configured to periodically repeat switching of power; and a distribution unit (the power distribution unit 32) configured to distribute output power of the switching unit to loads of a plurality of systems, and the unit support part is formed on a side of the distribution unit.

According to the in-vehicle power supply device having the above-described configuration [2], even though the impedance characteristics of the loads of the plurality of systems are different from each other, it is possible to individually adjust the impedance characteristic for each system and to respectively improve the noise level for each system by using the adjustment unit. Since the switching unit and the distribution unit can be physically separated from each other, it becomes easy to prevent a temperature rise of the distribution unit caused by heat generation of the switching unit.

[3] In the in-vehicle power supply device, the adjustment unit may include a plurality of electric circuits (the capacitors 14*b* to 14*d*) independent of each other in order to individually adjust impedance for each of the loads of the plurality of systems.

According to the in-vehicle power supply device having the above-described configuration [3], the impedance can be individually adjusted for each of the loads of the plurality of systems by an internal configuration of the adjustment unit to be mounted. Therefore, it becomes easy to optimize the noise characteristic for each system.

[4] In the in-vehicle power supply device, the distribution unit may include the plurality of unit support parts (the recessed parts 32*c* to 32*e*) in order to house the plurality of adjustment units individually corresponding to each of the loads of the plurality of systems.

According to the in-vehicle power supply device having the above-described configuration [4], a plurality of adjustment units can be simultaneously housed in the distribution unit. Therefore, when a plurality of loads having a different type and impedance are connected to the output of the distribution unit, the noise characteristic can be individually improved for each system by selecting and mounting an adjustment unit having an individually appropriate characteristic for each load. Since it is not required to incorporate a plurality of circuits in each adjustment unit, it is possible to reduce a type of adjustment unit prepared in advance.

In the in-vehicle power supply device, the adjustment unit may include at least one capacitor (14*b* to 14*d*) incorporated therein as the electric component.

According to the in-vehicle power supply device having the above-described configuration [5], since the capacitor incorporated in the adjustment unit functions as a filter, high frequency noise can be reduced. Since the capacitor used for such application has residual inductance inside, in a high frequency region, equivalently, a circuit in which a capacitance component (C) of one capacitor and a residual inductance component (L) thereof are connected in series is formed. That is, since the impedance decreases near a resonance frequency of the series circuit, only a high frequency noise component near the resonance frequency is filtered by connecting the series circuit between the power supply line and the ground.

According to the in-vehicle power supply device of the present invention, a sufficient countermeasure against noise can be performed, and even when a vehicle type on which the in-vehicle power supply device is mounted is different, commonization of a component number of a power supply component can be performed. That is, even though a specification of impedance in a wire harness connected to an output and a load of each system changes depending on a difference in a vehicle type, a noise level can be sufficiently reduced only by mounting an adjustment unit having an appropriate characteristic. Since it is not required to change a configuration and a specification of a main body of the in-vehicle power supply device, the same power supply component can be used in common for all vehicle types, such that cost reduction can be achieved.

What is claimed is:
1. An in-vehicle power supply device comprising:
a power supply part including a noise generation source and one or more output terminals capable of connecting a desired load to an output of the power supply part, wherein the power supply part includes an exterior housing through which the one or more output terminals are exposed to an exterior of the power supply device;
one or more adjustment units configured to house one or more electric components that affect impedance in the output of the power supply part in a unit housing in which at least a connection portion has a predetermined shape and size; and
a unit support part that is disposed inside the power supply part or between the output of the power supply part and the load, and that detachably supports the adjustment unit,
wherein the adjustment unit is detachably separable from the one or more output terminals of the power supply part without adjusting the exterior housing of the power supply part.
2. The in-vehicle power supply device according to claim 1, wherein:
the power supply part includes, within the exterior housing:
a switching unit configured to periodically repeat switching of power; and
a distribution unit comprising one or more circuit parts different from the output of the power supply part and configured to distribute output power of the switching unit to loads of a plurality of systems, the unit support part is formed on a side of the distribution unit, and the one or more adjustment units are electrically connected to power supply lines extending between the one or more circuit parts of the distribution unit and the one or more output terminals.

3. The in-vehicle power supply device according to claim 2, wherein the adjustment unit includes a plurality of electric circuits independent of each other in order to individually adjust impedance for each of the loads of the plurality of systems.

4. The in-vehicle power supply device according to claim 2, wherein the distribution unit includes a plurality of unit support parts in order to house a plurality of adjustment units individually corresponding to each of the loads of the plurality of systems.

5. The in-vehicle power supply device according to claim 2, wherein the distribution unit is disposed in a first housing separate from a second housing in which the switching unit is disposed.

6. The in-vehicle power supply device according to claim 2, wherein the unit support part is formed in the exterior housing.

7. The in-vehicle power supply device according to claim 1, wherein the adjustment unit includes at least one capacitor incorporated therein as the electric component.

* * * * *